United States Patent
Andoh et al.

[11] Patent Number: 5,877,718
[45] Date of Patent: Mar. 2, 1999

[54] DIFFERENTIAL ANALOG-TO-DIGITAL CONVERTER WITH LOW POWER CONSUMPTION

[75] Inventors: Hajime Andoh, Shiga; Tadashi Ohmori, Tasu-gun, both of Japan; Timothy Joseph Schmerbeck, Kasson, Mich.; Pantas Sutardja, San Jose; Denny Duan-Lee Tang, Saratoga, both of Calif.

[73] Assignee: International Business Machines Corporation, Armonk, N.Y.

[21] Appl. No.: 822,029

[22] Filed: Mar. 24, 1997

[51] Int. Cl.$^6$ .................................................. H03M 1/12
[52] U.S. Cl. ............................................ 341/155; 341/159
[58] Field of Search .................................... 341/155, 159, 341/161, 163, 156

[56] References Cited

U.S. PATENT DOCUMENTS

| | | | |
|---|---|---|---|
| 4,417,233 | 11/1983 | Inoue et al. | 340/347 |
| 4,547,763 | 10/1985 | Flamm | 340/347 CC |
| 4,612,531 | 9/1986 | Dingwall et al. | 340/347 |
| 4,999,630 | 3/1991 | Masson | 341/120 |
| 4,999,631 | 3/1991 | Sugimoto | 341/156 |
| 5,164,728 | 11/1992 | Matsuzawa et al. | 341/159 |
| 5,187,483 | 2/1993 | Yonemaru | 341/156 |
| 5,204,679 | 4/1993 | Jessner et al. | 341/159 |
| 5,210,537 | 5/1993 | Mangelsdorf | 341/156 |
| 5,231,399 | 7/1993 | Gorman et al. | 341/159 |
| 5,321,402 | 6/1994 | Matsuzawa et al. | 341/161 |
| 5,355,135 | 10/1994 | Redfern | 341/156 |
| 5,416,484 | 5/1995 | Lofstrom | 341/159 |
| 5,420,587 | 5/1995 | Michel | 341/156 |
| 5,436,629 | 7/1995 | Mangelsdorf | 341/156 |
| 5,451,952 | 9/1995 | Yamazaki et al. | 341/158 |
| 5,598,161 | 1/1997 | Yamada et al. | 341/159 |
| 5,684,486 | 11/1997 | Ono et al. | 341/159 |

OTHER PUBLICATIONS

G. M. Yin et al., A High–Speed CMOS Comparator with 8–b Resolution, IEEE Journal of Solid–State Circuits, vol. 27, No. 2, pp. 208–211, Feb. 1992.

P. Sutardja et al., 55–mW 300–MHz Analog–Digital Converters Using Digital VLSI Technology, Sympo. Of Low Power Electronics, San Jose, CA., Oct. 95.

*Primary Examiner*—Marc S. Hoff
*Assistant Examiner*—Peguy JeanPierre
*Attorney, Agent, or Firm*—Khanh Q. Tran

[57] ABSTRACT

An analog-to-digital (A/D) converter capable of receiving a differential input for improved noise rejection and having two static resistive ladders for reducing power consumption. The resistive ladders are anti-parallel and have a high impedance, each dividing fixed voltages into a group of reference voltages. A first stage of comparators compares the positive signal of the differential input with each of the reference voltages from one of the resistive ladder, and the negative input signal with each of the reference voltages from the other resistive ladder. The outputs of the first stage of comparators are compared by a second stage of comparators to generate a group of binary outputs in parallel. An encoder converts the outputs of the second-stage comparators into a digital value. Decoupling capacitors are also provided to reduce the AC impedance of the resistive ladders.

17 Claims, 8 Drawing Sheets

| $V_c$ | $V_b$ | $V_a$ | $V_{out}$ | |
|---|---|---|---|---|
| 0 | 0 | 0 | 0 | 0 |
| 0 | 0 | 1 | 0 | 1 |
| 0 | 1 | 1 | 1 | 0 |
| 1 | 1 | 1 | 1 | 1 |

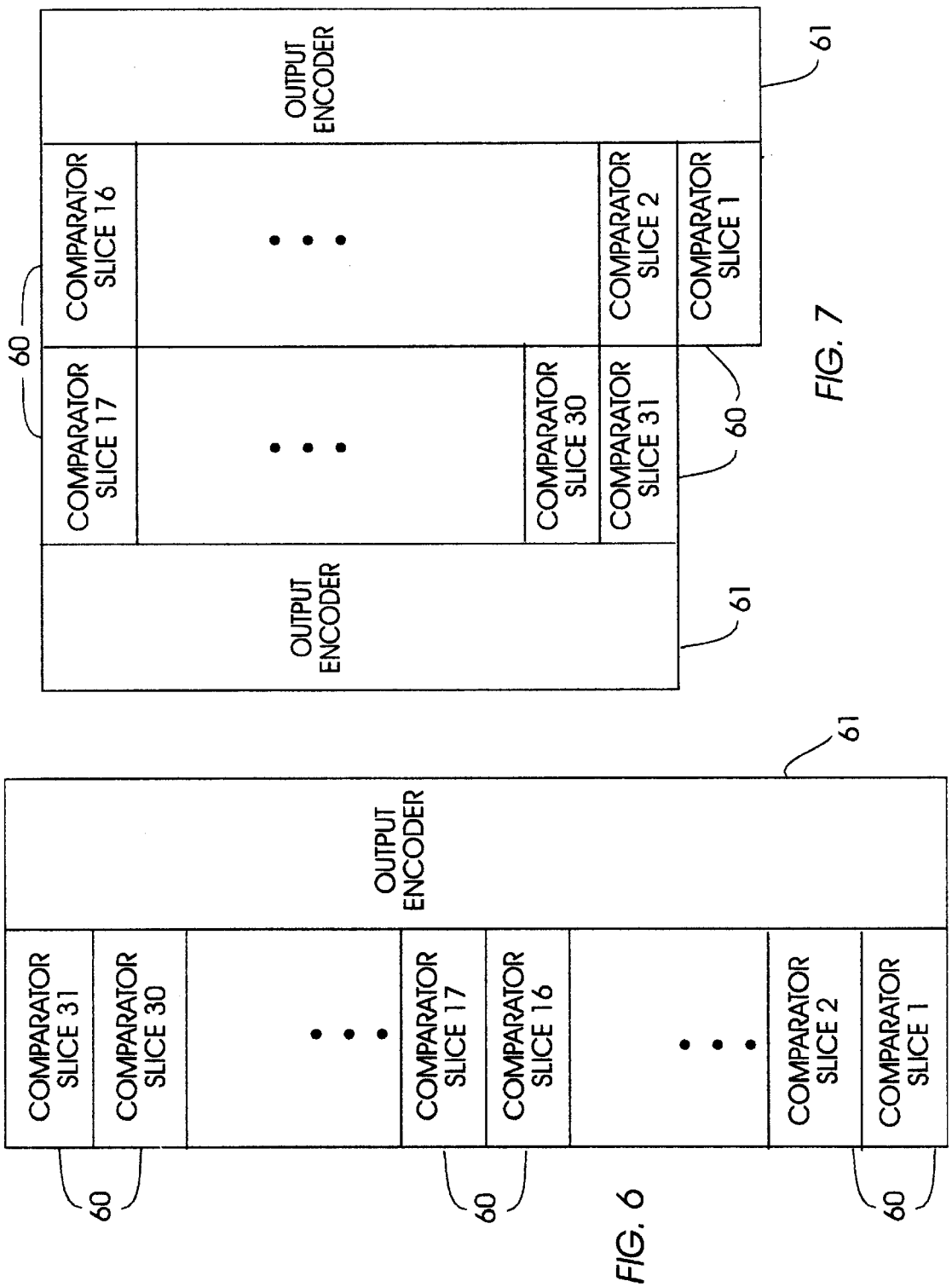

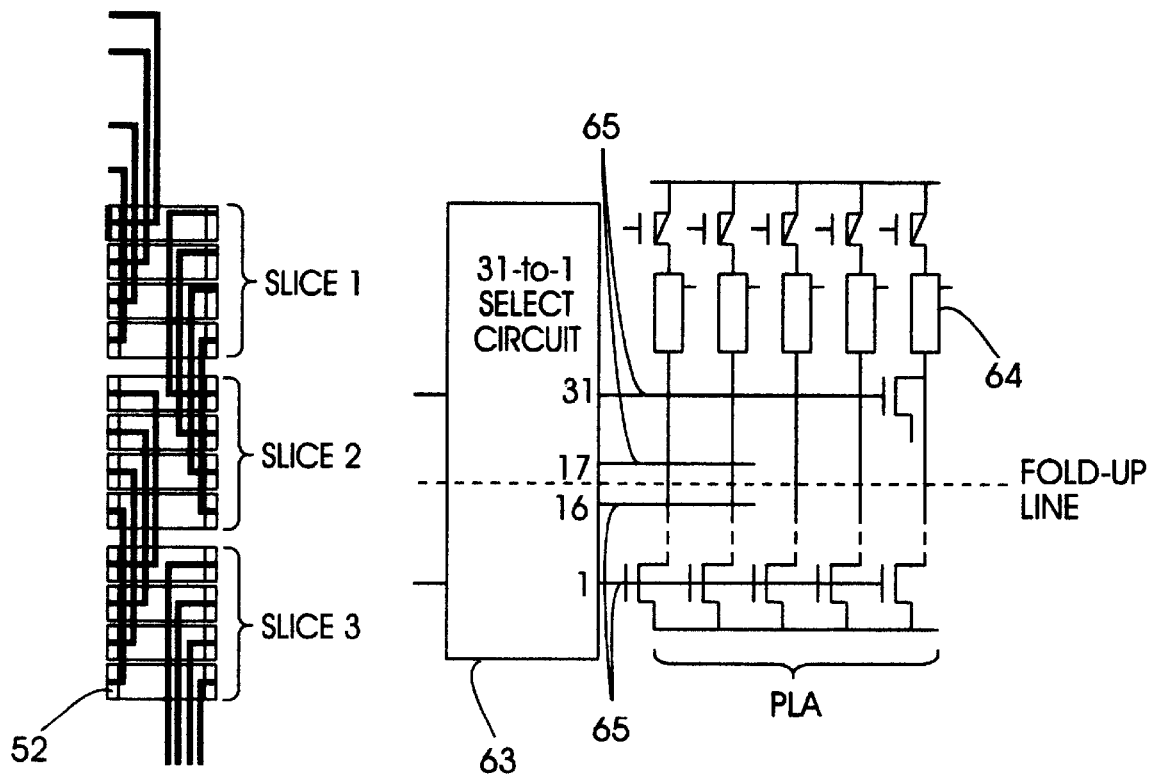
FIG. 11
FIG. 12
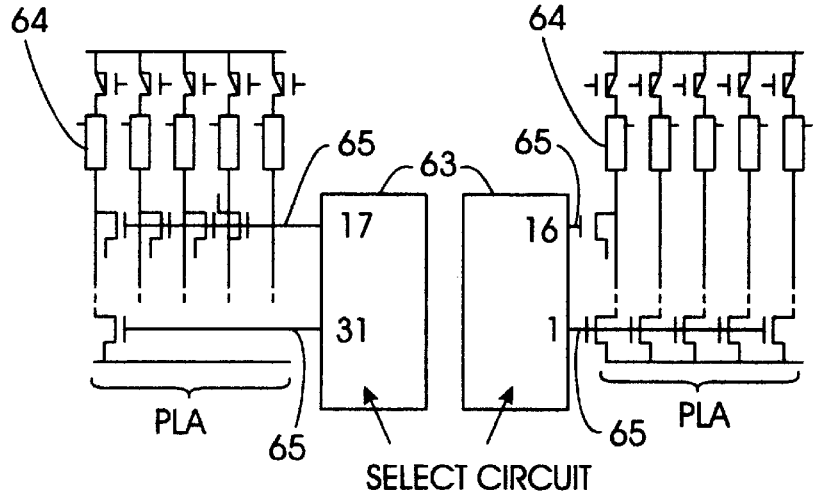
FIG. 13

DIFFERENTIAL ANALOG-TO-DIGITAL CONVERTER WITH LOW POWER CONSUMPTION

FIELD OF THE INVENTION

The present invention relates to analog-to-digital (A/D) converters, and more particularly, to an A/D converter that accepts a differential input for better rejection of electrical noise and employs static voltage reference resistor ladders for reduced power consumption.

BACKGROUND OF THE INVENTION

Analog-to-digital (A/D) converters are well-known electronic devices that are used in a wide variety of applications for converting an analog signal to a digital signal. A typical A/D converter includes some means for generating a group of reference voltages, a set of comparators for comparing the analog input with each of the reference voltages, and a circuit for encoding the outputs of the comparators as a digital value. FIG. 1A shows a simple A/D converter for generating a 2-bit digital output from an analog input signal $V_{in}$. The analog input signal $V_{in}$ is supplied to a driver 2 for driving the input resistor-capacitor (RC) circuits of the converter. A network of resistors 3 connected in series to divide a reference voltage $V_R$ into three smaller reference voltages, respectively at "tap points" 4, 5, and 6. Each of the tap reference voltages is compared to the input voltage $V_{in}$ by a comparator 7. In this case, three comparators 7 are needed for the three reference voltages, to produce binary outputs $V_a$, $V_b$, and $V_c$, respectively. For example, the comparators 7 produce a logical value "1" if the input signal $V_{in}$ is equal or greater than the tap reference voltage being compared to and a logical value "0" if the input signal is less than the compared reference voltage. An encoder 8 converts the outputs $V_a$, $V_b$, and $V_c$ into a 2-bit digital value according to some encoding scheme such as the one shown in FIG. 1B. Such an A/D converter is usually referred to as a single-ended or non-differential converter.

One of the problems of single-ended A/D converters is that they are highly susceptible to electrical noise such as that of the input signal, the power supply, and the switching of the reference voltages and comparators. To provide these converters with noise rejection capabilities, some prior art A/D converters were designed to receive a differential input such as the A/D converter shown in FIG. 2. The input stage of a conventional differential A/D converter of FIG. 2 typically includes a pair of drivers 20 for receiving the positive signal $V_{in}^+$ and negative signal $V_{in}^-$ of the differential input. The incoming analog differential signals $V_{in}^+$ and $V_{in}^-$ drive a pair of resistor ladders 21, respectively. Each of the resistor ladders 21 has a number of tap points 22 from which reference voltage levels are provided for comparing with the analog differential input signals. The voltage at each tap point 22 of the resistor ladders 21 follows the analog input signal that drives the respective resistor ladder, and is offset from the input signal by a fixed amount equal to the voltage drop across one or more resistors of the ladders.

The voltages from the taps 22 of the resistor ladders 21 are compared in parallel by a group of comparators 23 to generate outputs 24. Each comparator 23 compares the potential of a tap on a resistor ladder 21 with that of an opposite tap on the other resistor ladder. The outputs from the comparators 23 are then encoded as a digital value by encoder 25, as in the case of the A/D converter of FIG. 1A. These resistor ladders are referred to as dynamic ladders because the tap reference voltage levels vary depending on the differential input voltages $V_{in}^+$ and $V_{in}^-$, and not on some fixed voltage levels as in the ladders of FIG. 1A.

A major disadvantage of conventional differential A/D converters with dynamic resistor ladders, such as the one in FIG. 2, is that they typically have a relatively high power consumption. This is because the input currents from the drivers 20 must travel through the entire resistor ladders 21, which may include a large number of resistors as in the case of a digital output having many bits. Secondly, because the linearity of the A/D converter depends on how accurately the potential at each tap point follows the input signal, the resistor ladders 21 must have a bandwidth much wider than the analog input signals $V_{in}^+$ and $V_{in}^-$. Accordingly, the values of the resistors in the ladders 21 are typically kept very small, such as about 10Ω. The resistor ladders with such low resistance values, however, will dissipate a large amount of power. As a result, prior art differential input A/D converters that are designed to operate at high frequencies tend to have resistive ladders that consume a lot of electrical power, typically about 50% of the total power of the A/D converter.

U.S. Pat. No. 5,231,399 to Gorman et al., issued Jul. 27, 1993, discloses a differential quantizer reference resistor ladder for use in such an A/D converter. The converter receives positive and negative input signals and quantizes the input signals into quantization levels using two resistive networks. The quantization levels from the two networks are respectively compared, with their outputs being encoded into a digital value. Like other prior art differential A/D converters, this converter also employs dynamic resistor ladders driven by the input signals, and therefore consumes a high amount of power during operation.

In other prior art A/D converters, attempts have been made to reduce the power dissipation in the resistor ladders by using static ladders, rather than the dynamic ladders shown in FIG. 2. Static resistor ladders are those coupled to fixed voltage levels and not driven by the input signal, similar to the ladders in FIG. 1A. Another example of an A/D converter with static resistive ladders is shown in FIG. 3. In this case, a resistive ladder 31 divides a fixed reference voltage $V_T$, with respect to a fixed reference voltage $V_B$, into multiple tap reference voltages which appear at tap points 32 of the ladder 31. Since the voltages $V_T$ and $V_B$ are fixed, the reference voltages of the ladders are also fixed, or static. A group of comparators 33 compare an analog input $V_{in}$ with the tap reference voltages in parallel. The binary outputs of comparators 33 are then encoded into a digital value by an encoder 34. Note that the analog input signal no longer drives the resister ladders 31 and can be fed directly to a common input of the comparators 33. The resistors of the ladders 31 therefore can have a high resistance value in order to keep the power consumed by the A/D converter to a minimum. Although such a single-ended A/D converter with a static resistor ladder generally does not consume as much power as the conventional differential A/D converter described with reference to FIG. 2 above, it is still very susceptible to electrical noise as in the case of the A/D converter shown in FIG. 1A.

U.S. Pat. No. 4,612,531 to Dingwall et al., issued Sep. 16, 1986, discloses such a single-ended non-differential A/D converter. The disclosed converter employs a two-step conversion (referred to as a multi-step flash converter) to subdivide a reference voltage into multiple voltage steps using a single static resistor ladder. Although such a multi-step conversion generally reduces the total power consumed by the A/D converter, it increases the time delay in the analog-to-digital conversion and is still susceptible to the electrical noise problem.

U.S. Pat. No. 5,164,728 to Matsusawa et al., issued Nov. 17, 1992, discloses another single-ended non-differential A/D converter, but with complementary interpolating voltage dividers. The single input signal and reference voltages are differentially amplified by differential converting circuits, with interpolation resistors between the outputs of the converting circuits, for improved accuracy and speed. Since the resistive ladders are dynamic and the converter only accepts a single input signal, the disclosed A/D converter still suffers the problems with electrical noise and high power consumption described above.

Therefore, there remains a need for an efficient A/D converter capable of accepting a differential input for minimizing electrical noise interference, and using static resistive ladders for generating the reference voltages to achieve a low power consumption.

SUMMARY OF THE INVENTION

It is an object of the present invention to provide an A/D converter that can accept an analog input in differential form for better rejection of electrical noise such as the common mode noise of the input signal, noise from the circuit power supply and ground, and noise due to the switching of the reference potential and comparators.

It is another object of the present invention to provide an A/D converter with a low power consumption by using a pair of static resistor ladders for generating the required reference voltages, rather than dynamic resistor ladders.

It is a further object of the present invention to provide an A/D converter with resistive ladders that have a low AC impedance by coupling the tap voltages with capacitors tied to a common AC ground of the reference voltages.

It is still a further object of the present invention to provide an A/D converter in which repetitive comparator slices in the A/D converter are arranged in a fold-up configuration to facilitate its fabrication, improve the accuracy of the resistor ladders, and reduce the overall line delay time of the converter circuit.

To achieve these and other objects, the present invention provides an A/D converter having a pair of drivers for receiving the positive and negative signals of a differential analog input. A pair of static reference voltage generators divide the potential between fixed top and bottom reference voltages into a range of static reference voltages. A group of comparator pairs, each having a first comparator and a second comparator, is used to compare the reference voltages with the differential input signals. The first comparator of each pair compares the positive input signal with one of the reference voltages from the first reference voltage generator. The second comparator of each pair compares the negative signal of the differential input signals with one of the reference voltages from the second reference voltage generator. A third comparator is provided for each pair of first and second comparators, for generating a binary output from the outputs of the corresponding first and second comparators.

In the preferred embodiment of the invention, the outputs of each pair of first and second comparators are summed up and input to the respective third comparator to provide a differential comparison between each of the two reference voltage generators and each of the two phases in the differential input signal. An encoder, coupled to the outputs of the third comparators, generates a digital value from the outputs of the third comparators according to some predetermined encoding scheme.

Although other methods exist for generating reference voltages in an A/D converter, a pair of static, anti-parallel, high impedance resistor ladders is used in the preferred embodiment of the invention in order to minimize the power consumed by the reference voltage generators, and still achieve good noise rejection. In addition, to compensate for the high impedance of the static resistive ladders, a coupling capacitor is provided at each voltage tap of the resistive ladders to lower its AC impedance. The coupling capacitors are returned to an AC ground that tracks the ladder reference voltage AC ground.

In addition, for maximum conversion speed and minimum conversion latency and delay, the A/D converter of the invention may be used as a unit in a parallel or single-step flash A/D converter as well as a sub-element of a multi-step flash or sub-ranging A/D converters. The A/D converter of the invention may also be used as a full-flash converter.

Additional objects and advantages of the present invention will be set forth in the description which follows, and in part will be obvious from the description and with the accompanying drawing, or may be learned from the practice of this invention.

BRIEF DESCRIPTION OF THE DRAWINGS

FIG. 6 illustrates a partial physical layout for a 5-bit differential input analog-to-digital converter with static resistive ladders, in which the repetitive comparator slices are placed in a single long column.

FIG. 7 shows a partial physical layout for the A/D converter of FIG. 6, with the column of repetitive comparator slices being folded in half about its center, in accordance with the invention, to minimize the circuit line delay time and facilitate the fabrication of the converter.

FIG. 11 shows a variation of FIG. 10 in which the resistor connection lines are placed between the resistor ends to take advantage of the space between the ends of the resistors.

FIG. 12 shows a conventional layout of a PLA and its select circuit for the 5-bit A/D converter example of FIG. 6.

FIG. 13 shows a folded layout of the PLA circuit of FIG. 13, with the PLA and the selecting circuit 63 folded in two sections for reducing the PLA line length and improving the PLA line delay time.

DESCRIPTION OF THE PREFERRED EMBODIMENT

Figures 1A, 1B:
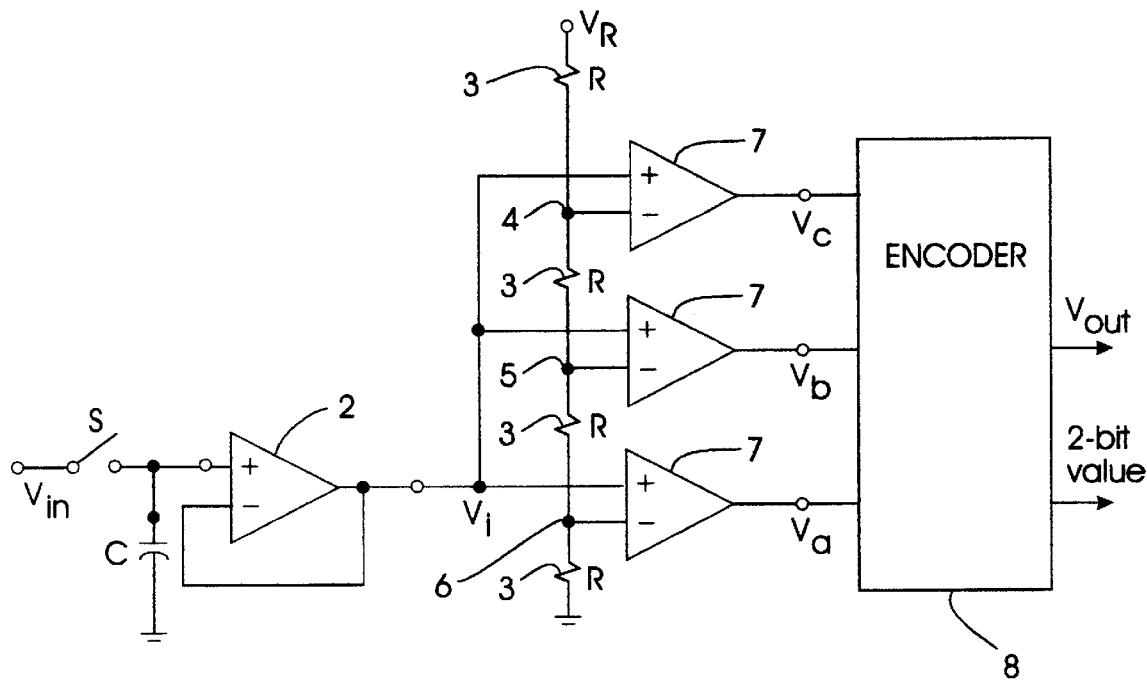
FIG. 1A is a simplified block diagram showing a conventional non-differential analog-to-digital converter with a static resistive ladder.
FIG. 1B shows a typical encoding scheme for the encoder 8 of FIG. 1A.
Figure 2:
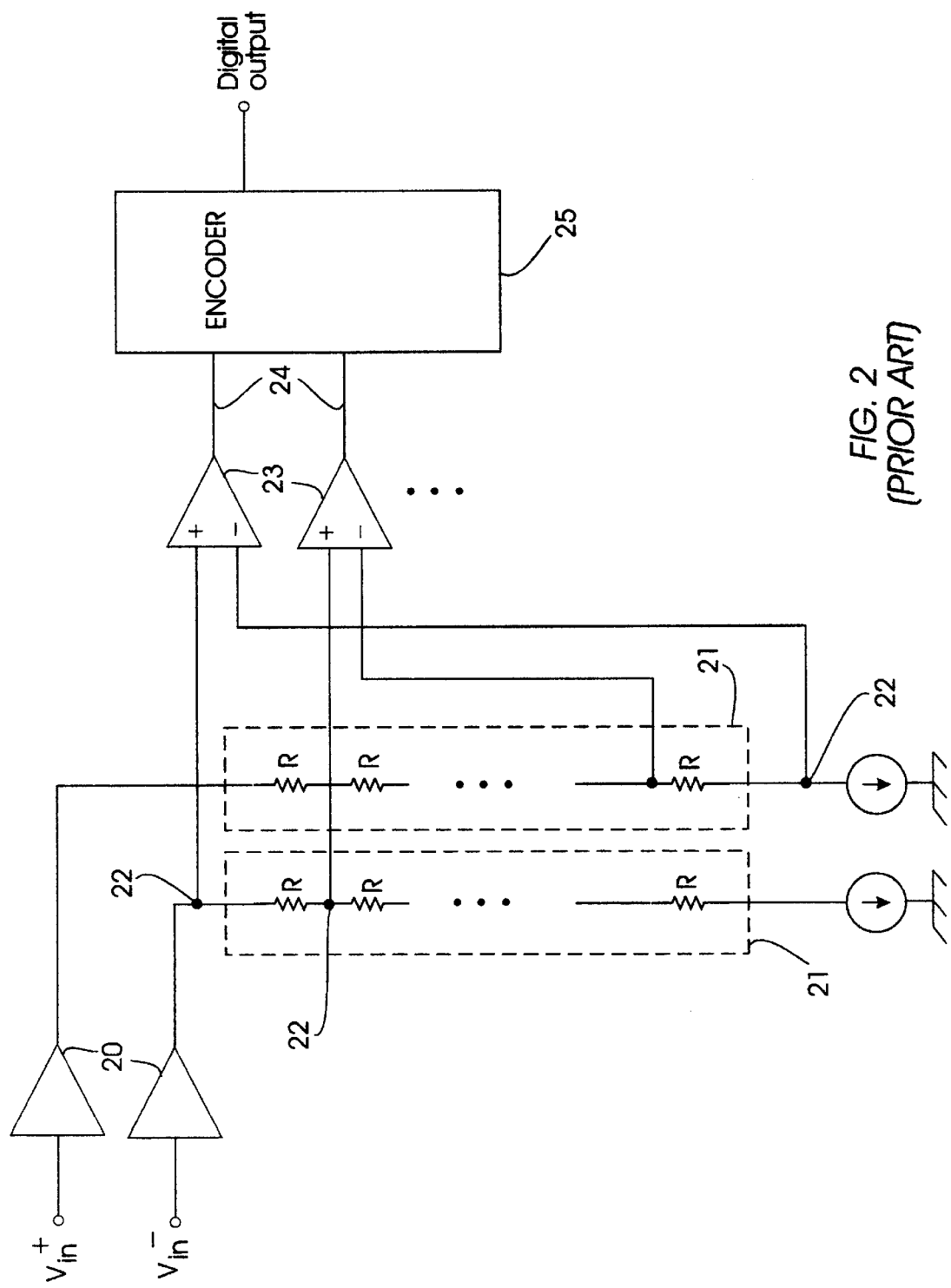
FIG. 2 is a block diagram of a prior art differential input analog-to-digital converter employing a pair of dynamic resistive ladders for generating the reference voltages.
Figure 3:
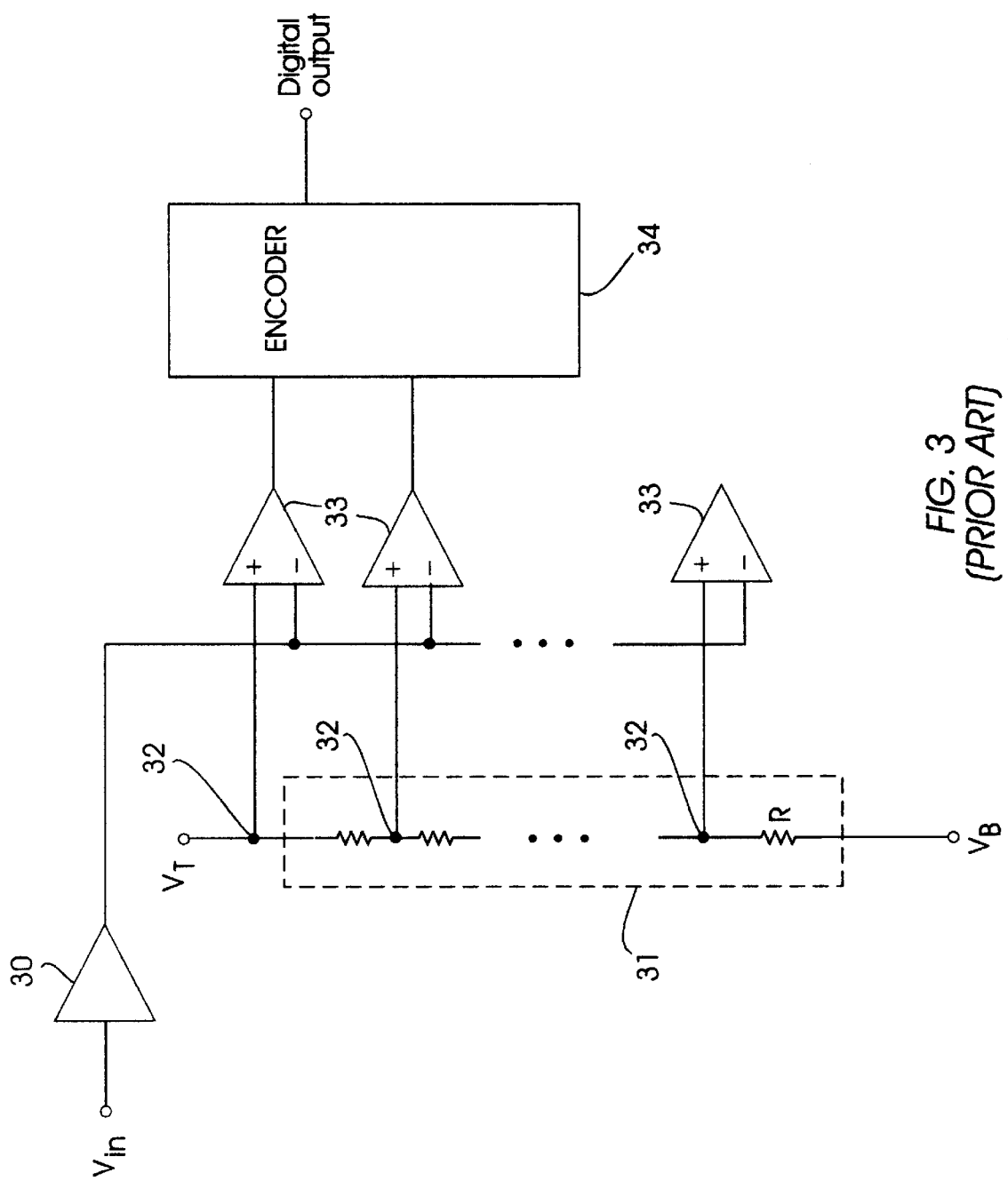
FIG. 3 is a block diagram of a prior art single-ended analog-to-digital converter having a static resistive ladder.
Figure 4:
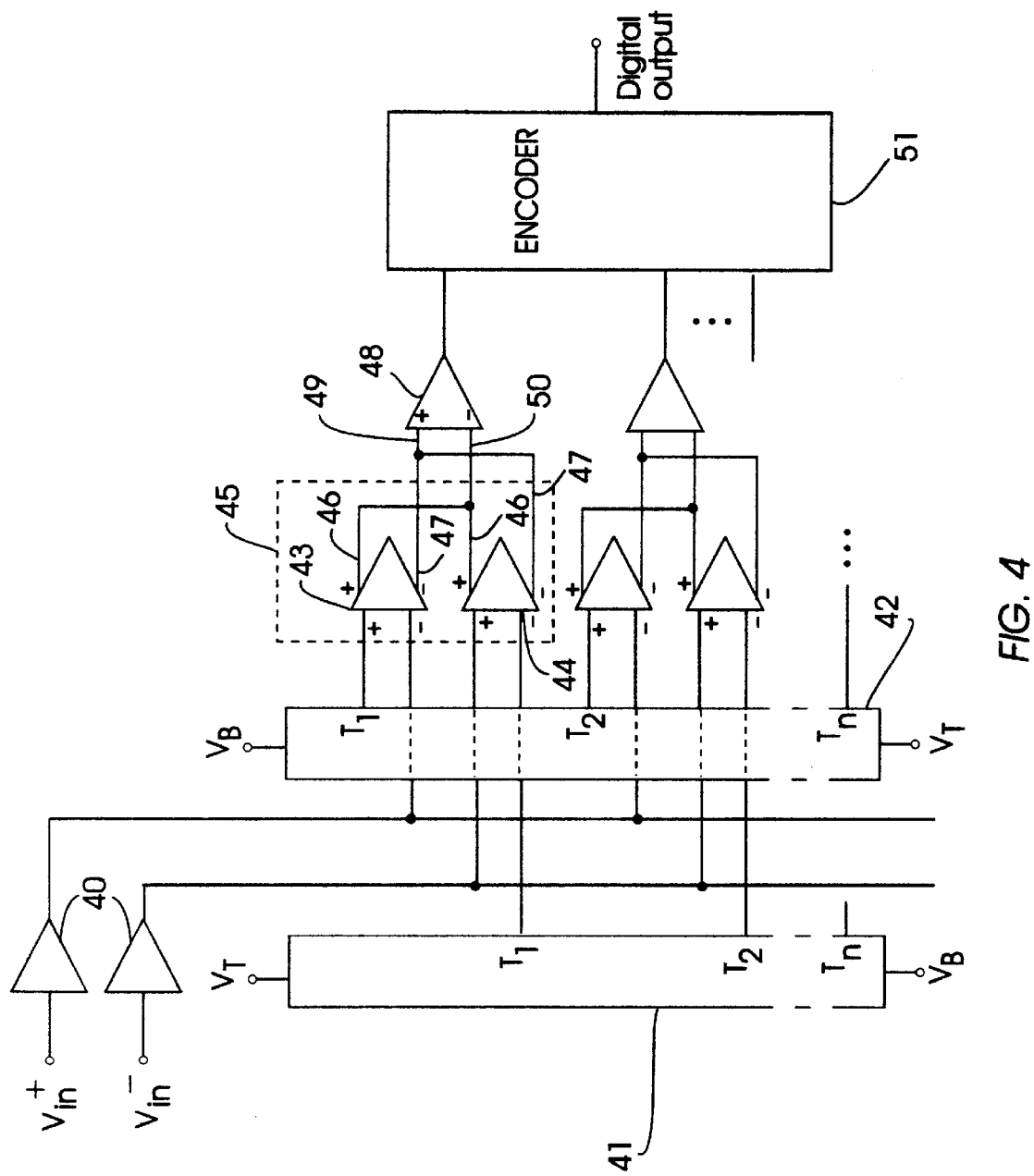
FIG. 4 is a block diagram of a differential input analog-to-digital converter having a pair of static reference voltage generators, in accordance with the present invention.

FIG. 4 shows a schematic block diagram of a differential input A/D converter with a pair of static reference voltage generators in accordance with the present invention, for high noise rejection capability and low power consumption. The differential input comprises a positive input signal $V_{in}^+$ and a negative input signal $V_{in}^-$, which are typically coupled to input drivers 40 for driving the generally large capacitive inputs of the converter. Two reference voltage generators, 41 and 42, are provided for respectively generating two sets of reference voltages from fixed voltage levels $V_T$ and $V_B$. Since $V_T$ and $V_B$ are fixed, the reference voltages provided by the reference voltage generators 41 and 42 are also fixed, or static. In addition, the two sets of reference voltages are anti-parallel. That is, the voltages $V_T$ and $V_B$ are coupled respectively to the first and second ends of the voltage generator 41, but to the second and first ends of the voltage generator 42, respectively, as shown by FIG. 4. Furthermore, in order to keep the power consumed by the reference voltage generators 41 and 42 to a minimum, it is preferred that each of the reference voltage generators 41 and 42 has a high impedance value, typically in the range of 1 KΩ to 100 KΩ, so that the current through each generator is as small as possible.

A first stage of comparators 43 and 44 is provided to compare the differential input signals $V_{in}^+$ and $V_{in}^-$, respectively, with each of the reference voltage levels from the reference voltage generators 41 and 42. As shown by FIG. 4, each comparator 43 compares the positive input signal $V_{in}^+$ with one of the reference voltages from the generator 42. Also, each comparator 44 compares the negative input signal $V_{in}^-$ with one of the reference voltages from the generator 41. In such a configuration, the analog differential signal drivers 40 would drive only the input capacitance of the comparators 43 and 44, but not the reference voltage generators 41 and 42 themselves. By not driving the input signals through the reference voltage generators, large power savings can be realized in the A/D converter of the invention.

As seen in FIG. 4, the comparators 43 and 44 form pairs of comparators. Each of the comparator pairs 45 includes a comparator 43 and a comparator 44 for respectively comparing the differential input signals $V_{in}^+$ and $V_{in}^-$ with the anti-parallel reference voltages from the voltage generators 42 and 41. For instance, the reference voltage at a tap $T_1$ of the generator 42, which is the same as that at tap $T_n$ of the generator 41, is compared with $V_{in}^+$ by a comparator 43. The reference voltage at a tap $T_1$ of the generator 41, which is the same as that at tap $T_n$ of the generator 42, is compared with $V_{in}^-$ by the comparator 44 of the same pair 45. Note that because the reference voltage generators 41 and 42 are anti-parallel, the reference voltage at tap $T_2$ of generator 42 is also the same as that at tap $T_{n-1}$ of the generator 41, and so on.

Each of the comparators 43 and 44 has an output 46 and a complementary output 47, designated respectively by the + and − signs next to these outputs, as shown in FIG. 4. The outputs 46 and 47 from the comparators of each comparator pair 45 are fed to the inputs 49 and 50 of a comparator 48. In the circuit configuration of FIG. 4, the outputs 46 of the comparators 43 and 44 for each comparator pair 45 are coupled together to feed the negative input 50 of the comparator 48. Similarly, the complementary outputs 47 of the same comparators 43 and 44 are coupled together to feed the positive input 49 of the comparator 48. In this arrangement, the output currents of comparators 43 and 44 are summed up to drive the comparator 48 inputs. The output of the comparator 48 thus depends on the sum of the output currents from the comparators 43 and 44 that are supplied to the inputs of comparator 48.

Alternatively, the output currents of the two comparators 43 and 44 may be subtracted from each other by tying the output 46 of the comparator 43 and the complementary output 47 of the comparator 44 together for feeding the input 49 of the comparator 48. Similarly, the complementary output 47 of comparator 43 is tied to the output 46 of the comparator 44 to feed the negative input 50 of the comparator 48. The A/D converter of FIG. 4 further includes an encoder 51 for encoding the outputs of the comparators 48 into a digital output value, which is similar to the encoders of the A/D converters in FIGS. 1–4.

Figure 5:
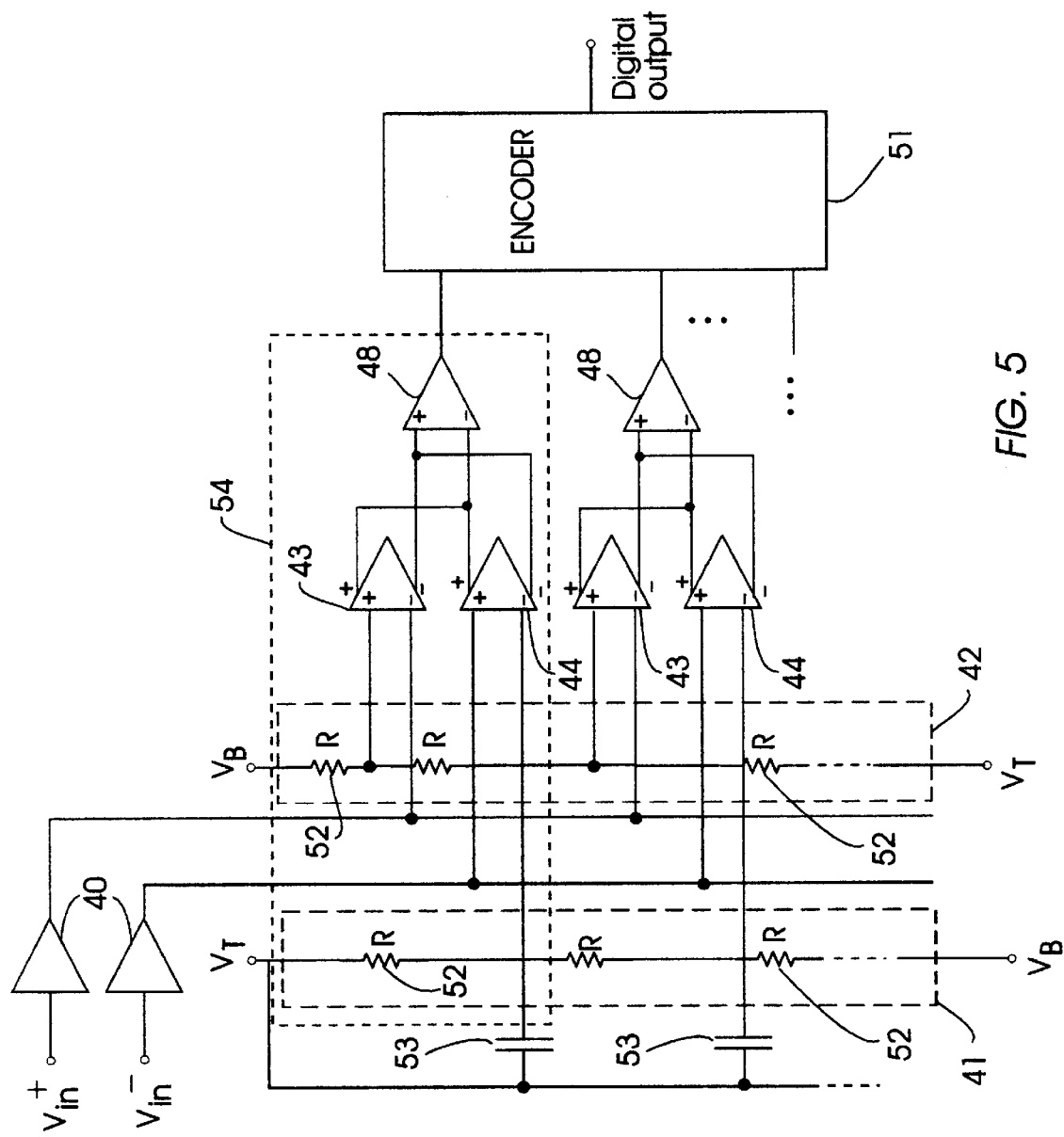
FIG. 5 is a circuit diagram showing a preferred embodiment of the differential input analog-to-digital converter represented by the block diagram of FIG. 4, using resistive ladders for generating the reference voltages and coupling capacitors for reducing the resistive ladders' AC impedance.

FIG. 5 shows a preferred embodiment of the A/D converter of the present invention in which each of the reference voltage generators 41 and 42 is a network of resistors 52 connected in series, and also referred to as a resistive ladder. Typically, the resistors 52 in each of the resistive ladders 41 and 42 have the same resistance value R to facilitate the fabrication of the converter's resistors. The ends of each resistive ladder are coupled respectively to fixed voltages $V_T$ and $V_B$, which are used for generating the reference voltages at the tap points of the ladders. In order to make the resistive ladders 41 and 42 anti-parallel, the top and bottom ends of the ladder 41 are coupled respectively to the voltages $V_T$ and $V_B$, while the bottom and top ends of the resistive ladder 42 are coupled respectively to $V_T$ and $V_B$. The comparators 43, 44, and 48 in the A/D converter of FIG. 5 are the same as those of FIG. 4, as described above. The outputs from the comparators 48 are then encoded into a digital value by the same encoder 51 as in FIG. 4, which is the output from the A/D converter.

In the preferred embodiment of the present invention, the A/D converter further includes coupling capacitors 53 to lower the AC impedance of the static resistive ladders 41 and 42 without consuming DC power, and stabilize the tap reference voltage levels. Such coupling capacitors 53 compensate for the large total impedance of the resistive ladders, which are chosen to have a generally high impedance value to minimize the A/D converter's power consumption. Also, for maximum noise rejection in the A/D converter, the coupling capacitors 53 are preferably returned to the same AC ground that is used for the input signals $V_{in}^+$ and $V_{in}^-$ and the fixed reference voltages $V_T$ and $V_B$. For example, FIG. 5 shows a coupling capacitor 53 provided between each tap point of the resistive ladder 41 and the constant voltage source $V_T$ to stabilize the tap voltages of the resistor ladder 41 and to lower its AC impedance value. Similar coupling capacitors are also provided between the tap points of the resistor ladder 42 and the fixed reference voltage $V_T$, which are not shown in FIG. 5. Like the value of the ladder resistors, the capacitors 53 typically have the same capacitance value to facilitate the circuit fabrication of the A/D converter of the invention.

In addition, for maximum conversion speed and minimum conversion latency and delay, the A/D converter of the invention may be used as a unit in a parallel or single-step flash A/D converter, or as an element of a multi-step flash or sub-ranging full flash A/D converter. Multi-step flash A/D converters are described, for example, in U.S. Pat. Nos. 5,436,629 and 5,210,537 to Mangelsdorf, issued Jul. 25, 1995 and May 11, 1993, respectively, and U.S. Pat. No. 5,187,483 to Yonemaru, issued Feb. 16, 1993. Semi-flash A/D converters are described, for example, in U.S. Pat. No. 5,355,135 to Redfern, issued Oct. 11, 1994.

Another aspect of the invention concerns the arrangement of the circuit components in a fabrication of the differential input A/D converter of the invention. Because of the repetitive nature of the circuit of the A/D converter with respect to the comparators and the resistor ladders, a fabrication of the A/D converter usually includes a large number of physical "slices" each having identical circuit components. Each slice typically includes a comparator 48, its corresponding comparators 43 and 44, a portion of the encoding circuit in the encoder 51 corresponding to the output of that comparator 48, and their interconnection lines. Each comparator slice might further include the resistors of the ladders 41 and 42 that supply the tap reference voltages used by the comparators in the slice, their corresponding coupling capacitors 53, and a respective portion of any other supporting circuits.

FIG. 6 shows a typical prior art physical layout for a 5-bit A/D converter of the present invention, such as in a semiconductor fabrication of the converter. To produce its 5-bit digital output, the converter has thirty-one repetitive comparator slices 60, each including a comparator 48, its respective comparators 43, 44, and the resistors 52 of ladders 41 and 42 that correspond to these comparators (as shown in FIG. 5). Each comparator slice 60 corresponds to the portion of the A/D converter designated as block 54 in FIG. 5. In a conventional layout of the circuit of the A/D converter, the slices 60 would be placed sequentially one after the other in the plane of the slices, forming a long column of comparator slices 60 as shown in FIG. 6. For an n-bit A/D converter, the column would have its slice 1 at one end and the slice $2^n-1$ (which is 31 in the example of a 5-bit A/D converter) at the other end. Such a layout, however, has several disadvantages.

First, because of the relatively large distance between the first and last slices in the slice column, it is difficult to fabricate the slice components so that they would have substantially the same characteristics. For instance, it would be difficult to match the values of similar resistors in all of the comparator slices 60 in a semiconductor fabrication of the converter. This is because the values of semiconductor resistors typically do not match well when the resistors are not in proximity of one another and do not have a minimum separation between their geometric centers. Secondly, because of the large spacing between some comparator slices in the single column of slices, the conventional layout results in a long line delay time for the A/D converter, which contributes to the overall converter delay time.

Thus, in accordance with the invention, the column of comparator slices is folded (or partitioned) about its midpoint to divide the column into two halves, each having generally the same number of comparator slices 60. FIG. 7 shows an example of a fold-up layout for part of a typical 5-bit A/D converter in accordance with the invention, where the column of comparators 60 is divided between the 16-th and 17-th slices. In this configuration, the comparator slices 60 in the top half of the column (slices 17 through 31) are placed along side those of the bottom half of the column (slices 1 through 16). The portion of the encoder 61 for each half of the slice column is on the side opposite the common side of the comparator slices 60. The resistors 52 in each half of the slice column are now generally closer to those in the other half, as compared to the single column layout of FIG. 6. In general, the fold-up layout of FIG. 7 reduces the maximum seperation distance between any two resistors 52 by four times in comparison to the conventional single-column layout. By having the resistors 52 closer to each other, their values can be made identical or almost identical in a semiconductor fabrication. Such a resistance matching is important because all of the resistors 52 in each resistive ladder need to have the same resistance value for the A/D converter to have a perfect or zero integral non-linearity.

Furthermore, since each comparator in an A/D converter is typically made up of transistors and the orientation of the transistors in the left-half slices are changed by 180°, these transistors may be laid out as pairs of common centroid devices so as not to be sensitive to the orientation flip. A common centroid layout is one that is symmetrical in both the x and y directions in the plane of the circuit, and is not sensitive to a fabrication process that has a directional preference. Thus, in a layout of the A/D converter with pairs of common centroid devices, the flipped comparator slices would function the same way as they did in a conventional layout. For a more detailed discussion of common centroid devices, see "Analysis and Design of Analog Integrated Circuits," by P. R. Gray and R. G. Meyer, 1977, Wiley, N.Y.

Figure 8:
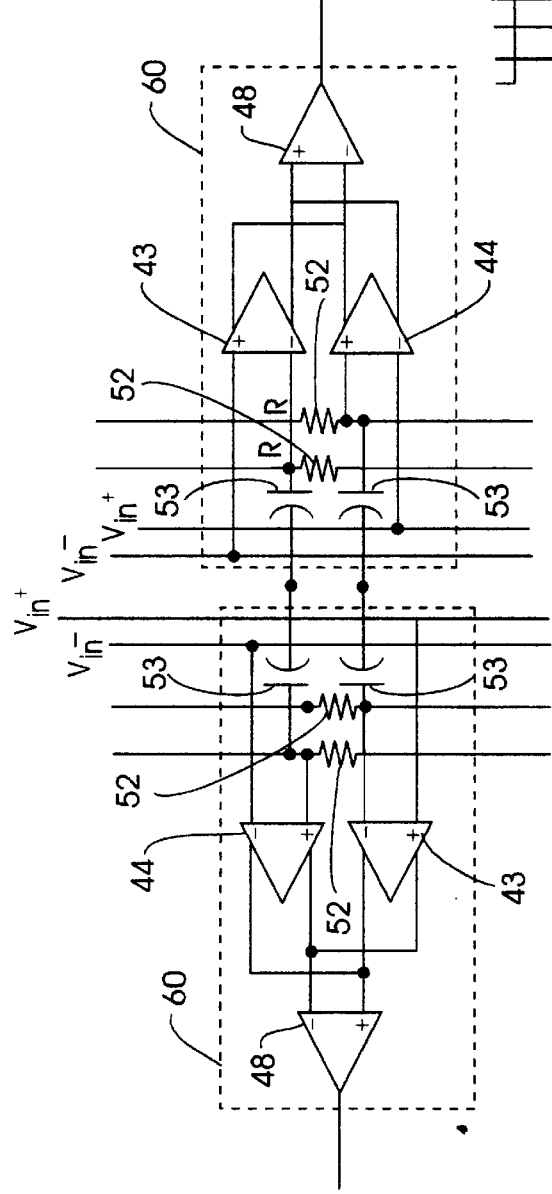
FIG. 8 shows further details of two horizontally adjacent comparator slices 60 from the folded layout of FIG. 7, where each comparator slice 60 includes a pair of comparators, and their respective resistors and coupling capacitors.
Figure 9:
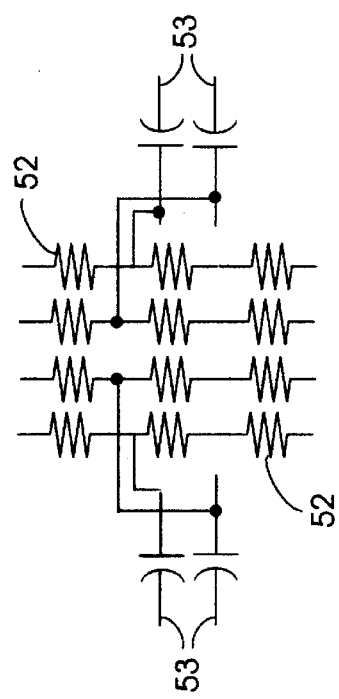
FIG. 9 shows a partial layout of the two adjacent comparator slices 60 of FIG. 8, with the resistors 52 being grouped together and their coupling capacitors 53 placed on each side of the resistor group.

FIG. 8 shows further details of two horizontally adjacent comparator slices 60 in a folded layout, as depicted by FIG. 7. Each comparator slice 60 is shown as including a comparator 48, a comparator 43, a comparator 44, their respective resistors 52 and coupling capacitors 53. Since the matching of the value of coupling capacitors 53 is not as critical as the matching of the value of the resistors 52, these passive elements can be arranged such that to allow a closer spacing between the resistors 52, as shown in FIG. 9. Thus, FIG. 9 shows a partial layout of the two adjacent comparator slices 60 of FIG. 8, with the four resistors 52 of the two slices being grouped together and their corresponding coupling capacitors 53 placed on each side of the group of resistors 53.

Figure 10:
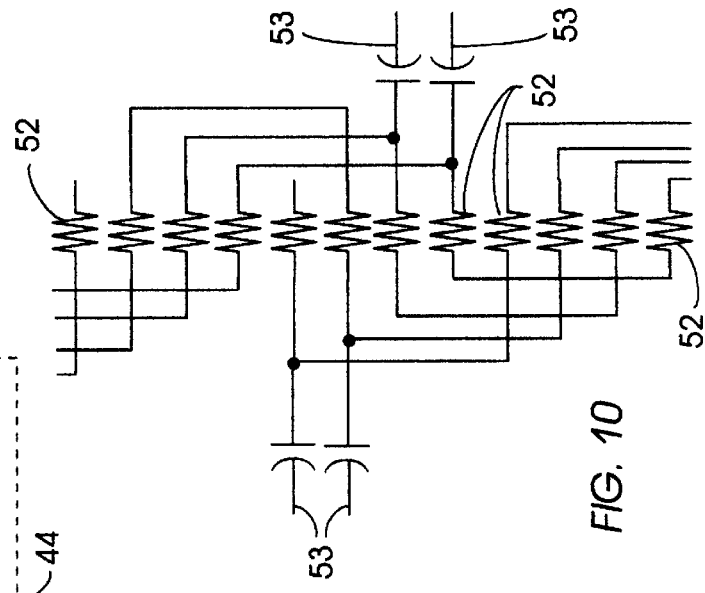
FIG. 10 shows a variation of the layout of FIG. 9 in which the resistors 52 are turned 90° to accommodate electrical wiring to the resistor ends in the case of bar resistors.

FIG. 10 shows a variation of the circuit layout of FIG. 9 in which the orientation of resistors 52 is turned 90° to accommodate electrical connection to the end contacts of the resistors 52. This configuration is particularly useful when the resistors of the A/D converter are bar type resistors, as in the case of semiconductor resistors. FIG. 11 shows a variation of FIG. 10 in which the resistor connection lines are placed between the ends of the resistors 52 to make the circuit layout of the A/D more compact, taking advantage of the space between the resistor ends and the rearranged orientation of the resistors.

The benefits of arranging the repetitive comparator slices 60 in a fold-up layout of the differential A/D converter may be exploited further by including latches, programmable logic arrays (PLAs), and drivers of the A/D converter in the folded circuit portion. This can be easily accomplished by adding the repetitive parts of these components to the end of the repetitive comparator slices 60 and partitioning them as in the case of the slices alone, as described above with respect to FIGS. 7–11. FIG. 12 shows a conventional layout of a PLA for the 5-bit A/D converter example above, with its select lines 65 coupled to a 31-to-1 selecting circuit 63. The PLA also includes latches 64. FIG. 13 shows the physical layout of the same PLA, but with the PLA and the selecting circuit 63 folded in two sections. Such a layout typically reduces the PLA line length, and thus the line delay time, by a factor of four.

While several preferred embodiments of the invention have been described, it should be apparent that modifications and adaptations to those embodiments may occur to persons skilled in the art without departing from the scope and the spirit of the present invention as set forth in the following claims.

What is claimed is:

1. An analog-to-digital converter for generating a digital output from a differential analog input having a positive signal and a negative signal, the converter comprising:

first and second reference voltage generators for generating a plurality of first reference voltages and a plurality of second reference voltages, respectively;

a plurality of comparator pairs each having a first comparator and a second comparator, the first comparator comparing one of the first reference voltages with the positive input signal, the second comparator comparing one of the second reference voltages with the negative input signal, and the first and second comparators each having an output and a complementary output;

a plurality of third comparators corresponding respectively to the comparator pairs, each third comparator comparing the outputs of the first and second comparators in a corresponding comparator pair with the respective complementary outputs, said third comparator having an output; and means for encoding the outputs of the third comparators as a digital value.

2. The analog-to-digital converter according to claim 1, wherein:

the first and second reference voltage generators each includes a plurality of resistors connected in series between its first and second ends, the first end of the first generator and the second end of the second generator being coupled to a top reference voltage, the second end of the first generator and the first end of the second generator being coupled to a bottom reference voltage; and each of the first and second reference voltages is offset from the next one by a voltage drop across one of the resistors.

3. The analog-to-digital converter according to claim 2, wherein the resistors have an identical resistance value.

4. The analog-to-digital converter according to claim 2, wherein:

the converter includes a plurality of repetitive slices each having one of the third comparators, the slices forming a column next to the encoding means; and the column of slices and encoding means are partitioned into two halves of generally the same length, the two halves being positioned side-by-side in the plane of the slices such that the slices in one half are adjacent the slices of the other half, for minimizing circuit delay time in the converter.

5. The analog-to-digital converter according to claim 4, wherein each repetitive slice includes the comparator pair coupled to the third comparator of the slice.

6. The analog-to-digital converter according to claim 5, wherein the repetitive slice includes the resistors of the first and second reference voltage generators that generate the reference voltages coupled to the comparator pair in the slice.

7. The analog-to-digital converter according to claim 6, wherein:

a capacitor is coupled between each of the first and second reference voltages and a constant voltage for stabilizing the respective reference voltage; and the repetitive slice includes the capacitors coupled to the reference voltages used by the comparators of the slice.

8. The analog-to-digital converter according to claim 7, wherein the resistors of two adjacent slices, each slice being from a different half of the column, are grouped together, the capacitors coupled to the reference voltages used by the adjacent slices being placed on either side of the resistor group.

9. The analog-to-digital converter according to claim 8, wherein the orientation of the resistors of the adjacent slices are turned 90° to accommodate electrical connection to the resistor ends.

10. The analog-to-digital converter according to claim 4, wherein:

each comparator of the converter includes a plurality of transistors; and the transistors in each repetitive slice are arranged as pairs of common centroid devices so that the operation of the transistors is not affected by the re-arrangement of the repetitive slices.

11. The analog-to-digital converter according to claim 4, wherein:

the encoding means includes a programmable logic array (PLA) coupled to a select circuitry, the PLA having a plurality of PLA internal electrical lines; and the PLA and the select circuitry are partitioned into two halves, together with the rest of the encoding means, the two halves of the PLA being positioned adjacent to one another for reducing the length of the PLA lines.

12. The analog-to-digital converter according to claim 1, wherein each of the first and second reference voltages is stabilized with respect to a constant voltage by a capacitor.

13. The analog-to-digital converter according to claim 1, wherein each third comparator subtracts the outputs of the first and second comparators of the corresponding comparator pair from the respective complementary outputs in generating the third comparator output.

14. The analog-to-digital converter according to claim 1, wherein:

each of the comparators has a positive input terminal and a negative input terminal;

the positive and negative input signals are coupled to the negative input terminals of the first comparators and the positive input terminals of the second comparators, respectively;

the first and second reference voltages are coupled to the positive input terminals of the first comparators and the negative input terminals of the second comparators, respectively;

the outputs of the first and second comparators in each comparator pair are coupled to the negative input terminal of the corresponding third comparator; and the complementary outputs of the first and second comparators in each comparator pair are coupled to the positive input terminal of the corresponding third comparator.

15. The analog-to-digital converter according to claim 1, wherein the converter is part of a single-step flash A/D converter arrangement.

16. The analog-to-digital converter according to claim 1, wherein the converter is part of a multi-step flash A/D converter arrangement.

17. The analog-to-digital converter according to claim 1, wherein the converter is part of a full-flash A/D converter arrangement.

* * * * *